United States Patent [19]

Sasaki et al.

[11] Patent Number: 5,757,028
[45] Date of Patent: May 26, 1998

[54] THIN FILM TRANSISTOR WITH REDUCED LEAKAGE CURRENT

[75] Inventors: Kazuhiro Sasaki, Sagamihara; Hiromitsu Ishii, Kouchi; Makoto Sasaki, Tokyo; Yoshitomo Wada, Nankoku, all of Japan

[73] Assignee: Casio Computer Co., Ltd., Tokyo, Japan

[21] Appl. No.: 937,891

[22] Filed: Sep. 25, 1997

Related U.S. Application Data

[63] Continuation of Ser. No. 514,399, Aug. 11, 1995, abandoned.

[30] Foreign Application Priority Data

Aug. 23, 1994  [JP]  Japan .................... 6-219567

[51] Int. Cl.$^6$ ................................................. H01L 29/04
[52] U.S. Cl. ......................... 257/57; 257/52; 257/61; 257/347; 257/352
[58] Field of Search .......................... 257/52, 57, 61, 257/347, 352

[56] References Cited

U.S. PATENT DOCUMENTS

| 5,114,869 | 5/1992 | Tanaka et al. | 257/57 |
| 5,371,398 | 12/1994 | Nishihara | 257/57 |

FOREIGN PATENT DOCUMENTS

| 61-208876 | 9/1986 | Japan | 257/57 |
| 1-50567 | 2/1989 | Japan | 257/57 |

*Primary Examiner*—Valencia Martin Wallace
*Attorney, Agent, or Firm*—Frishauf, Holtz, Goodman, Langer & Chick

[57] ABSTRACT

A thin film transistor which can reduce production of leakage current between the source and drain electrodes and a fabricating method therefor, are disclosed. In the thin film transistor, an insulating film is formed on at least a portion of each side, corresponding to the region between the source and drain electrodes, of the peripheral side surface of the intrinsic semiconductor film, so that no metal silicide is formed thereon.

14 Claims, 12 Drawing Sheets

1

THIN FILM TRANSISTOR WITH REDUCED LEAKAGE CURRENT

This application is a Continuation of application Ser. No. 08/514,399, filed Aug. 11, 1995, now abandoned.

BACKGROUND OF THE INVENTION

1. Field of the Invention

The present invention relates to a thin film transistor and a method for fabricating the same.

2. Description of Related Art

Layer structures of thin film transistors are of various types; e.g., the so-called staggered type which has a structure in which an intrinsic semiconductor film is disposed between a gate electrode and source and drain electrodes, and the gate electrode is disposed in the side opposite to an insulating substrate; the reverse staggered type which has a structure in which a gate electrode is disposed on the insulating substrate, in contrast with the staggered type; the so-called coplanar type which has a structure in which an intrinsic semiconductor film is disposed outside of a layer structure of source and drain electrodes, a gate insulating film and a gate electrode, and the gate electrode is disposed in the side opposite to an insulating substrate; the reverse coplanar type which has a structure in which a gate electrode is disposed on the insulating substrate, in contrast with the coplanar type; and the like.

FIG. 24 is a vertical longitudinal sectional view illustrating an example of a conventional thin film transistor of the reverse staggered type. FIG. 25 is a partially broken plan view thereof.

As illustrated in these figures, the thin film transistor comprises a gate electrode 2 formed on an insulating substrate 1 made of glass or the like, a gate insulating film 3 made of silicon nitride covering the gate electrode 2, an intrinsic semiconductor film 4 made of amorphous silicon provided on the gate insulating film 3, a blocking insulating film 5 made of silicon nitride which is provided on a channel region of the intrinsic semiconductor film 4, and a source electrode 7s and a drain electrode 7d which are formed on the intrinsic semiconductor film 4 through an n-type semiconductor film 6 made of doped amorphous silicon.

Such a thin film transistor is generally fabricated by the following process.

First, the gate electrode 2 is formed on the substrate 1, thereafter, the gate insulating film 3, the intrinsic semiconductor film 4, and the blocking insulating film 5 are formed on the substrate 1 in this order, as shown in FIG. 26. Then, the blocking insulating film 5 is patterned in a shape which can cover the channel region of the intrinsic semiconductor film 4.

Next, an n-type semiconductor film 6 is formed on the intrinsic semiconductor film 4 and the blocking insulating film 5, as shown in FIG. 27. Then, the n-type semiconductor film 6 is patterned in a shape which corresponds to that of source and drain regions, and the intrinsic semiconductor film 4 is patterned in a predetermined shape, as shown in FIG. 28.

Because the channel region, i.e., the region between the source and drain regions, of the intrinsic semiconductor film 4 is covered by the blocking insulating film 5, the channel region of the intrinsic semiconductor film 4 does not suffer damage during etching of the n-type semiconductor film 6 to be patterned.

Patterning of the intrinsic semiconductor film 4 is generally carried out when patterning the n-type semiconductor film 6, by etching the intrinsic semiconductor film 4, using a resist mask 10 formed on the n-type semiconductor film, and the blocking insulating film 5, as a mask. Therefore, the intrinsic semiconductor film 4 is patterned in approximately the same outline in plan as that of the patterned n-type semiconductor film 6 and the blocking insulating film 5.

After the resist mask 10 is removed, a metal film 7 for source and drain electrodes is formed, as shown in FIG. 29. The formed metal film 7 is patterned to form a source electrode 7s and a drain electrode 7d. Thus, a thin film transistor is completed, as shown in FIG. 30.

However, such a conventional thin film transistor of the reverse staggered type has a metal silicide layer m on the peripheral side surface of the intrinsic semiconductor film 4, as shown in FIGS. 24 and 25. For this reason, there is a problem of production of a leakage current which flows between the source and drain electrodes through the metal silicide layer m.

The metal silicide layer m is formed when the metal film 7 for source and drain electrodes is formed in the fabrication process of a thin film transistor. That is, when the metal film 7 is formed on the n-type semiconductor film 6 and the intrinsic semiconductor film 4 which were patterned in a state shown in FIG. 28, the metal film 7 comes directly in contact with exposed peripheral side surfaces of the intrinsic silicon semiconductor film 4 and of the n-type semiconductor film 6. Consequently, the metal silicide layer m is produced on the interface of these silicon semiconductor films 4 and 6 and the metal film 7, as shown in FIG. 29.

Although the formed metal film 7 for source and drain electrodes is patterned, as shown in FIG. 30, because metal silicide is hard to be etched, the metal silicide layer m remains on the peripheral side surfaces of the intrinsic semiconductor film 4 and of the n-type semiconductor film 6.

Because the metal silicide layer m is conductive, when the metal silicide layer m exists on the peripheral side surface of the intrinsic semiconductor film 4, a leakage current which flows between the source and drain electrodes through portions of the metal silicide layer which correspond to both sides of a region between the source and drain electrodes, is produced. Such a problem occurs not only in a thin film transistor of the reverse staggered type but also in a thin film transistor of the coplanar type.

SUMMARY OF THE INVENTION

An object of the present invention is to provide a thin film transistor which can reduce production of leakage current between the source and drain electrodes and to provide a fabricating method therefor.

The present invention was developed in view of the above-described problems.

In accordance with one aspect of the present invention, the thin film transistor comprises a gate electrode; a gate insulating film formed on the gate electrode; an intrinsic semiconductor film for forming a channel region, disposed at a position at which the gate insulating film is sandwiched between the intrinsic semiconductor film and the gate electrode, and having an insulating film on at least portions of the peripheral side surface of the intrinsic semiconductor film, corresponding to both sides of the channel region; and source and drain electrodes provided on portions of the intrinsic semiconductor film which sandwich the channel region, through an n-type semiconductor film.

In such a thin film transistor, because an insulating film is formed on at least a portion of each peripheral side surface of the intrinsic semiconductor film, corresponding to both sides of the region between the source and drain electrodes, no metal silicide layer is formed on the portions of the peripheral side surface of the intrinsic semiconductor film, which have the insulating film thereon and correspond to the region between the source and drain electrodes when the metal film for source and drain electrodes is formed thereon. Therefore, no leakage current between the source and drain electrodes through any metal silicide layer is produced.

Preferably, the intrinsic semiconductor film comprises silicon, e.g., amorphous silicon, polysilicon or the like. The material of the insulating film formed on the peripheral side surface of the intrinsic semiconductor film may be selected from various types of insulating materials, e.g., oxide, nitride, and the like. The insulating film formed on the peripheral side surface of the intrinsic semiconductor film may be formed on the entirety of the peripheral side surface. Preferably, the thin film transistor has a structure of the reverse staggered type, i.e., a structure in which the gate electrode is formed on an insulating substrate, and the intrinsic semiconductor film is disposed between the gate electrode and the source and drain electrodes, or of the coplanar type, i.e., a structure in which the intrinsic semiconductor film is formed on an insulating substrate, and the source and drain electrodes are disposed between the gate electrode and the intrinsic semiconductor film.

The thin film transistor may further comprise a blocking insulating film for covering the channel region formed between the source electrode and the drain electrode, on the intrinsic semiconductor film. According to the thin film transistor having such a structure, the channel region of the intrinsic semiconductor film does not suffer damage during etching of the n-type semiconductor film to be patterned.

In such a thin film transistor, the intrinsic semiconductor film may have approximately the same shape in plan as that of the n-type semiconductor film in the regions of the source and the drain and of the blocking insulating film. According to such a structure, patterning of the n-type semiconductor film and the intrinsic semiconductor film and oxidation of the intrinsic semiconductor film can be efficiently carried out by a series of steps.

In accordance with another aspect of the present invention, the method for fabricating a thin film transistor comprises the steps of: forming an intrinsic semiconductor film on a gate insulating film which covers a gate electrode; forming an n-type semiconductor film in shapes which correspond to those of source and drain regions, on the intrinsic semiconductor film; patterning the intrinsic semiconductor film in a predetermined shape; forming an insulating film at least on a portion of each peripheral side surface of the patterned intrinsic semiconductor film, corresponding to the region between the source and drain electrodes; and forming source and drain electrodes on the n-type semiconductor film after the step for forming the insulating film on the peripheral side surface.

In such a method for fabricating a thin film transistor, after an insulating film is formed at least on a portion of each peripheral side surface of the patterned intrinsic semiconductor film, corresponding to the region between the source and drain electrodes, the metal film for source and drain electrodes is formed. Accordingly, when the metal film for source and drain electrodes is formed, no metal silicide layer is formed at least on the portion of each peripheral side surface of the patterned intrinsic semiconductor film, which corresponds to the region between the source and drain electrodes and has the insulating film thereon. Therefore, it is possible to provide a thin film transistor, e.g., of the reverse staggered type, the coplanar type, or the like, which enables sharp reduction of production of leakage current between the source and drain electrodes.

Such a method for fabricating a thin film transistor may further comprise steps of: forming a blocking insulating film on the formed intrinsic semiconductor film, and of patterning the formed blocking insulating film in shapes which cover the channel region of the intrinsic semiconductor film, after the step of forming the intrinsic semiconductor film, and prior to the step of forming the n-type semiconductor film. The patterning of the intrinsic semiconductor film may be carried out by etching the intrinsic semiconductor film, using a resist mask formed on the n-type semiconductor film and the blocking insulating film as a mask, when patterning the n-type semiconductor film. In this case, formation of the insulating film on the peripheral side surface of the intrinsic semiconductor film may be carried out by exposing the peripheral side surface to the oxygen plasma or by reacting the peripheral side surface in an atmosphere of nitrogen.

Accordingly, it is possible to efficiently carry out patterning of the n-type semiconductor film and the intrinsic semiconductor film and formation of the insulating film on the peripheral side surface of the intrinsic semiconductor film, by a series of steps. It is also possible to obtain a good ohmic contact of the n-type semiconductor film and the source and drain electrodes formed thereon because the upper surface of the n-type semiconductor film is not oxidized by the oxygen plasma or is not nitrided by the atmosphere of nitrogen, during forming the insulating film, e.g., an oxide, a nitride or the like, on the peripheral side surface of the intrinsic semiconductor film.

In accordance with a further aspect of the present invention, the method for fabricating a thin film transistor comprises the steps of: forming an intrinsic semiconductor film on a gate insulating film which covers a gate electrode; forming an n-type semiconductor film on the intrinsic semiconductor film; patterning the intrinsic semiconductor film and the n-type semiconductor film, in a shape corresponding to a device region forming the transistor; forming an insulating film at least on a portion of each peripheral side surface of the patterned intrinsic semiconductor film, corresponding to the region between the source and drain electrodes; forming a metal film for source and drain electrodes on the n-type semiconductor film; and forming a channel of the transistor by patterning the metal film to form source and drain electrodes, and by removing the portion of the n-type semiconductor film which exists between the source and drain electrodes.

According to such a method for fabricating a thin film transistor, no metal silicide layer is formed at least on the portion of each peripheral side surface of the patterned intrinsic semiconductor film, which corresponds to the region between the source and drain electrodes and has the insulating film thereon. Therefore, it is possible to provide a thin film transistor without a blocking insulating film, which enables sharp reduction of production of leakage current between the source and drain electrodes.

In accordance with another aspect of the present invention, the method for fabricating a thin film transistor comprises the steps of: forming an intrinsic semiconductor film on a substrate; forming an n-type semiconductor film on the intrinsic semiconductor film; patterning the n-type semiconductor film and the intrinsic semiconductor film in a predetermined shape; forming an insulating film at least on a portion of each peripheral side surface of the patterned intrinsic semiconductor film, corresponding to the region between the source and drain electrodes; forming a metal film for source and drain electrodes on the n-type semiconductor film, after the step of forming the insulating film on the peripheral side surface; patterning the metal film to form source and drain electrodes; patterning the n-type semiconductor film in shapes corresponding to those of the source and drain regions; forming a gate insulating film on the source and drain electrodes and on the intrinsic semiconductor film between these electrodes, to pattern in a predetermined shape; and forming a gate electrode on the gate insulating film to pattern in a predetermined shape.

According to such a method for fabricating a thin film transistor, it is possible to provide a thin film transistor of the coplanar type which enables sharp reduction of production of leakage current between the source and drain electrodes.

In the method for fabricating a thin film transistor, the formation of the insulating film on the peripheral side surface of the intrinsic semiconductor film is preferably carried out prior to removing a resist mask for patterning the n-type semiconductor film in a predetermined shape. According to such a method, it is possible to efficiently carry out patterning of the n-type semiconductor film and the intrinsic semiconductor film and formation of the insulating film on the peripheral side surface of the intrinsic semiconductor film, by a series of steps. It is also possible to obtain a good ohmic contact of the n-type semiconductor film and the source and drain electrodes formed thereon because the upper surface of the n-type semiconductor film is not oxidized or nitrided, during forming the insulating film on the peripheral side surface of the intrinsic semiconductor film.

In any of the above-described methods for fabricating a thin film transistor, formation of the insulating film on the peripheral side surface of the intrinsic semiconductor film is preferably carried out by oxidizing or nitriding the peripheral side surface. The oxidizing or nitriding of the peripheral side surface may be performed by reacting the intrinsic semiconductor film in an atmosphere of the oxygen plasma or nitrogen.

BRIEF DESCRIPTION OF THE DRAWINGS

The present invention will become more fully understood from the detailed description given hereinbelow and the accompanying drawings which are given by way of illustration only, and thus are not limitative of the present invention, and wherein;

FIGS. 4-9 are vertical sectional views illustrating successive steps in fabricating the thin film transistor of the reverse staggered type according to a first embodiment of the present invention; wherein FIG. 4 illustrates a blocking insulating film being patterned, FIG. 5 illustrates an n-type semiconductor film being formed thereon, FIG. 6 illustrates the n-type semiconductor film and the intrinsic semiconductor film being patterned, FIG. 7 illustrates the peripheral side surface of the intrinsic semiconductor film being oxidized, FIG. 8 illustrates source and drain electrodes being formed thereon, and FIG. 9 illustrates the source and drain electrodes being patterned;

DESCRIPTION OF THE PREFERRED EMBODIMENT

Hereinafter, thin film transistors according to embodiments of the present invention will be explained with reference to the drawings.

First Embodiment

Figure 1:
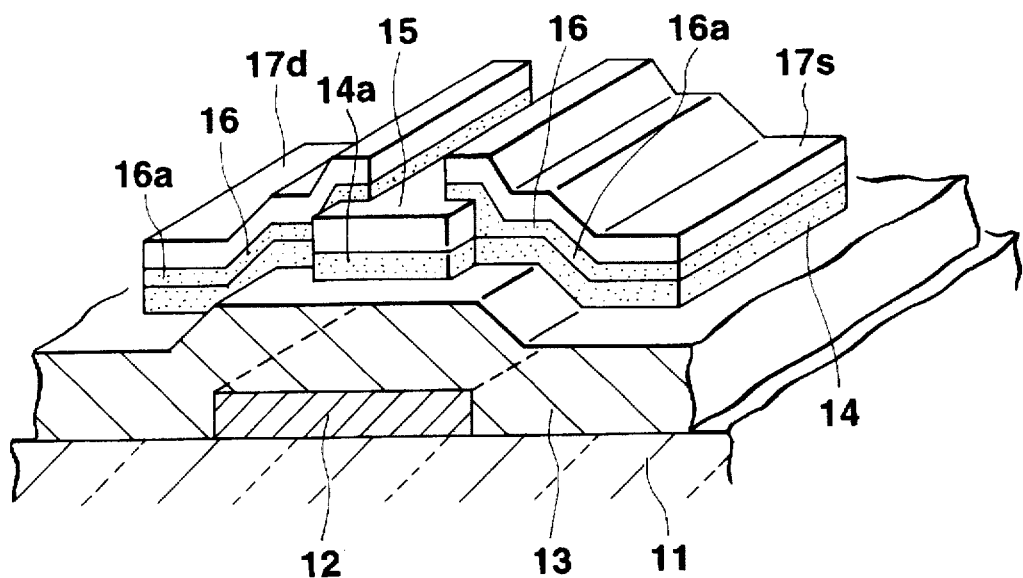
FIG. 1 is a perspective view of a thin film transistor of the reverse staggered type according to a first embodiment of the present invention.
Figure 2:
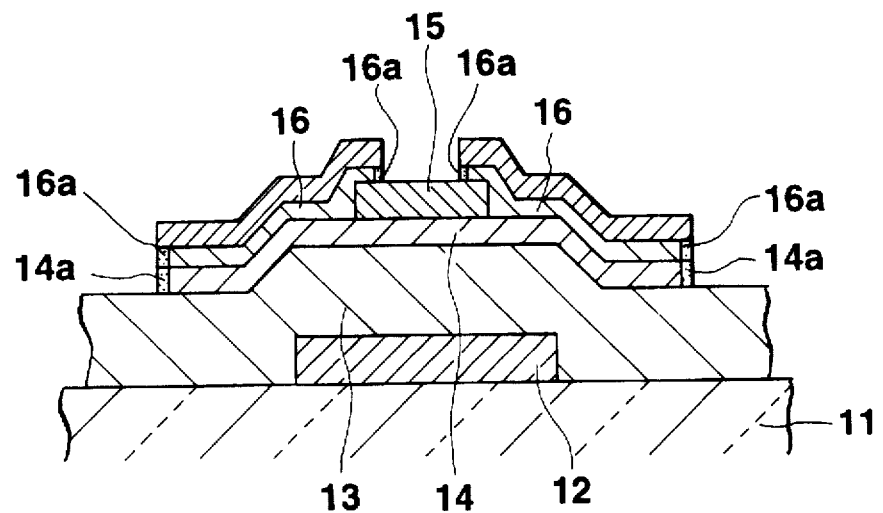
FIG. 2 is a vertical sectional view of the thin film transistor.
Figure 3:
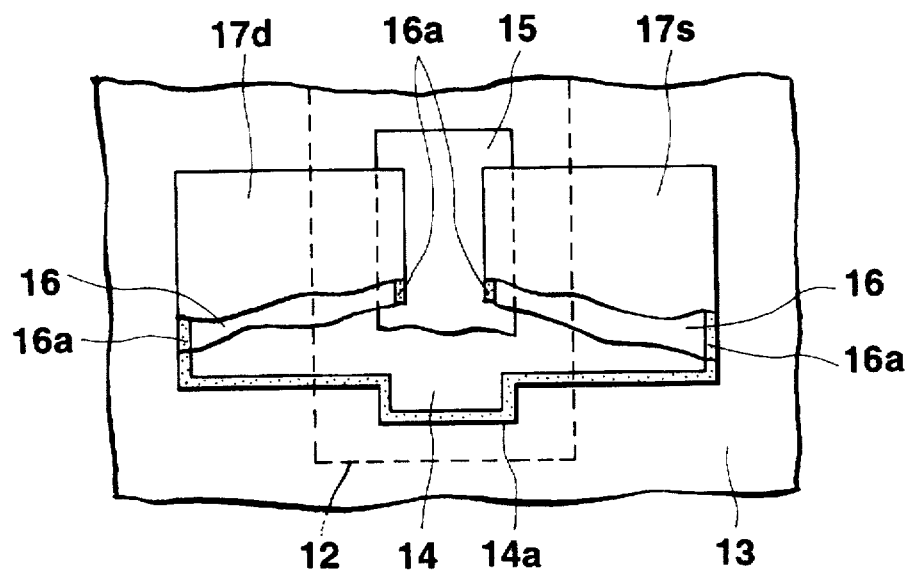
FIG. 3 is a partially broken plan view of the thin film transistor.

FIG. 1 is a perspective view of a thin film transistor according to the first embodiment of the present invention. FIG. 2 is a vertical sectional view thereof, and FIG. 3 is a partially broken plan view thereof.

As shown in these figures, the thin film transistor according to this embodiment has a structure of the so-called reverse staggered type. The thin film transistor comprises a gate electrode 12 of a metal formed on an insulating substrate 11 of glass or the like, a gate insulating film 13 of silicon nitride covering the gate electrode 12, an intrinsic semiconductor film 14 of amorphous silicon provided on the gate insulating film 13, a blocking insulating film 15 of silicon nitride which is provided on a channel region of the intrinsic semiconductor film 14, and a source electrode 17s and a drain electrode 17d which are formed on the intrinsic semiconductor film 14 through an n-type semiconductor film 16 of doped amorphous silicon. In this embodiment, the intrinsic semiconductor film 14 has approximately the same shape in plan as that which is formed by the n-type semiconductor film 16 in the regions of the source and the drain and by the blocking insulating film 15.

In the thin film transistor, an oxide film is formed on the entirety of the peripheral side surface of the intrinsic semiconductor film 14. In these figures, reference numeral 14a denotes an oxide film formed on the peripheral side surface of the intrinsic semiconductor film 14. The oxide film 14a is made of silicon oxide.

In this embodiment, also on the entirety of the peripheral side surface of the n-type semiconductor film 16 in the source and drain regions, an oxide film 16a of silicon oxide is formed.

FIGS. 4-9 are vertical sectional views illustrating successive steps in fabricating the thin film transistor of the reverse staggered type according to the above-described first embodiment. The thin film transistor is fabricated by the following steps.

Step 1

Figure 4:
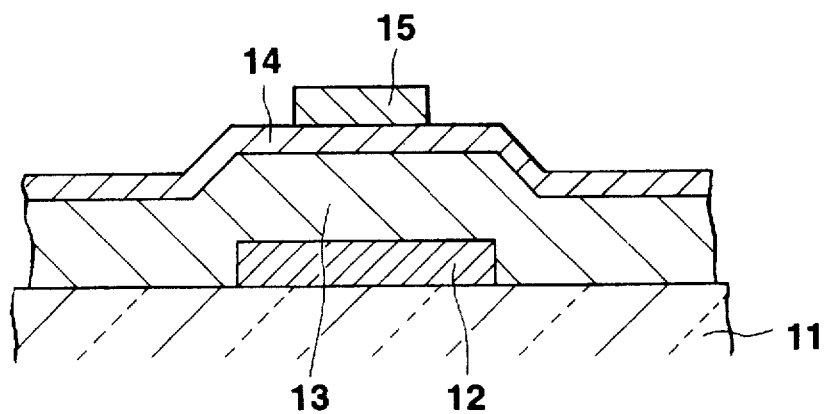

First, after the gate electrode 12 is formed on the substrate 11 of glass or the like, the gate insulating film 13 of silicon nitride, the intrinsic semiconductor film 14, and the blocking insulating film 15 of silicon nitride are formed on the substrate 11 in this order, by a plasma CVD system, as shown in FIG. 4. Thereafter, the blocking insulating film 15 is patterned in a shape which can cover the channel region of the intrinsic semiconductor film 14, by photolithography method. The above gate electrode 12 is formed by forming a metal film on the substrate 11 by a sputtering system or the like and by patterning the formed metal film by photolithography method.

Step 2

Figure 5:
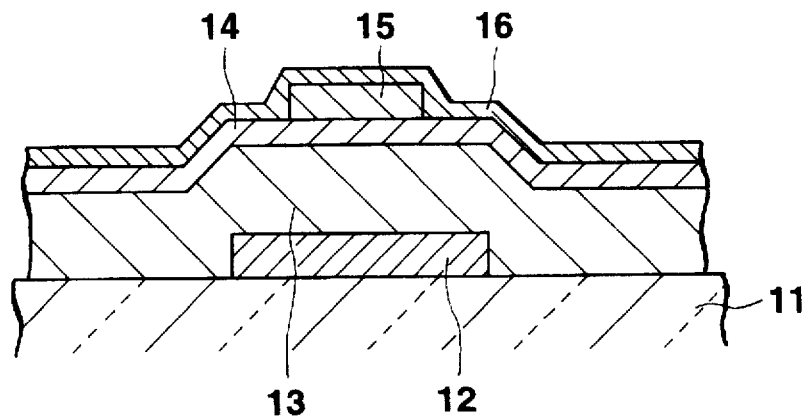

Next, an n-type semiconductor film 16 of doped amorphous silicon is formed on the intrinsic semiconductor film 14 and the blocking insulating film 15 by a plasma CVD system, as shown in FIG. 5.

Step 3

Figure 6:
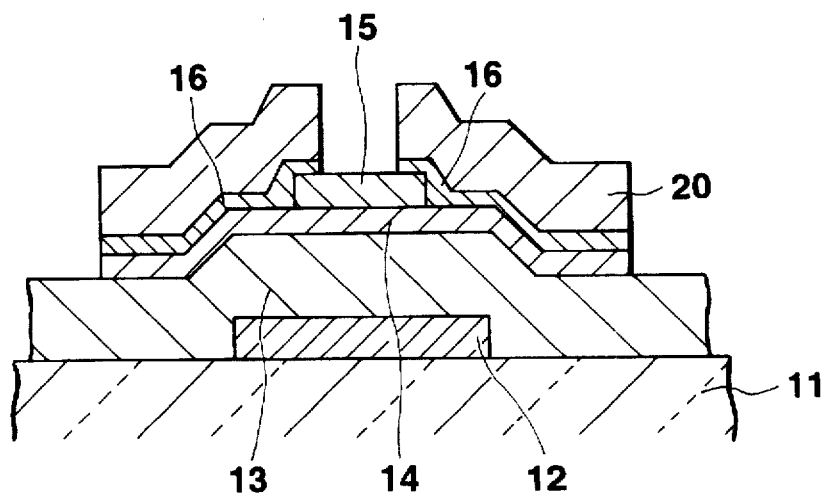

Then, the n-type semiconductor film 16 is patterned in a shape which corresponds to that of source and drain regions, and the intrinsic semiconductor film 14 is patterned in a predetermined shape, as shown in FIG. 6.

Because the channel region, i.e., the region between the source and drain regions, of the intrinsic semiconductor film 14 is covered by the blocking insulating film 15, the channel region of the intrinsic semiconductor film 14 does not suffer damage during etching of the n-type semiconductor film 16 to be patterned.

Patterning of the intrinsic semiconductor film 14 is performed when patterning the n-type semiconductor film 16, by etching the intrinsic semiconductor film 14, using a resist mask 20 formed on the n-type semiconductor film and the blocking insulating film 15 as a mask.

When the intrinsic semiconductor film 14 is etched by using a resist mask 20 and the blocking insulating film 15 as a mask in this manner, the intrinsic semiconductor film 14 is patterned in approximately the same shape in plan as that which is formed by the n-type semiconductor film 16 in the regions of the source and the drain and by the blocking insulating film 15.

Step 4

Figure 7:
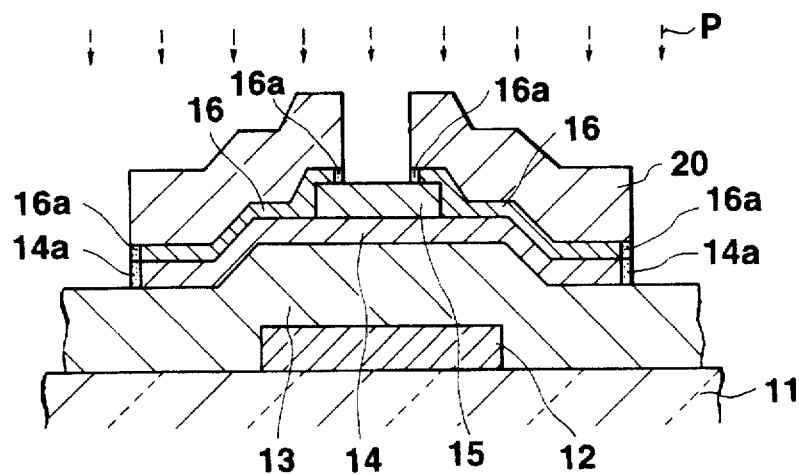

Next, the peripheral side surface of the intrinsic semiconductor film 14 is oxidized by using oxygen plasma P, with the resist mask 20 on the n-type semiconductor film 16 being not removed and remaining, as shown in FIG. 7. When the intrinsic semiconductor film 14 is oxidized by using oxygen plasma P, with the resist mask 20 on the n-type semiconductor film 16 remaining, the exposed peripheral semiconductor film 16 remaining, the exposed peripheral side surface of the intrinsic semiconductor film 14 is exposed to oxygen plasma P, thereby the peripheral side surface is oxidized to form an oxide film 14a of silicon oxide over the entire periphery and the entire height thereof.

At this time, an oxide film 16a is also formed on the peripheral side surface of the n-type semiconductor film 16 because the exposed peripheral side surface of the n-type semiconductor film 16 is exposed to oxygen plasma P and thereby is oxidized.

Step 5

Figure 8:
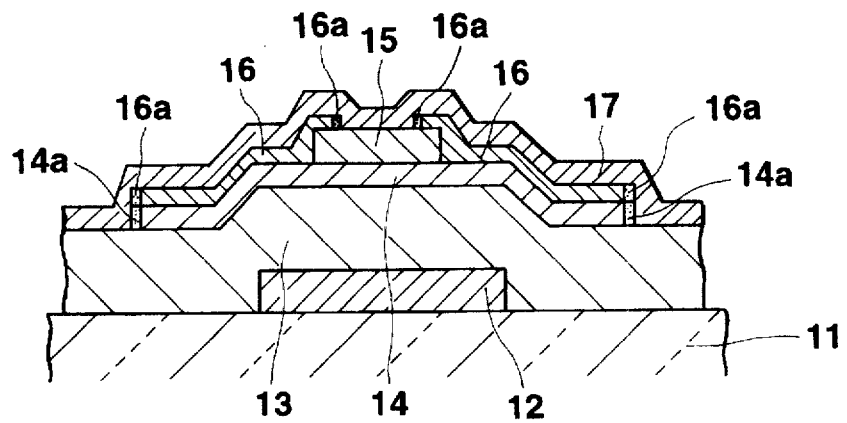

Next, after the resist mask 20 is removed, a metal film 17 for source and drain electrodes is formed by a sputtering system, as shown in FIG. 8.

During formation of the metal film 17 for source and drain electrodes, any metal silicide layer is not formed on the peripheral side surface of the intrinsic semiconductor film 14 because the oxide film 14a of silicon oxide is formed over the entire periphery and the entire height of the exposed peripheral side surface of the intrinsic semiconductor film 14.

Step 6

Figure 9:
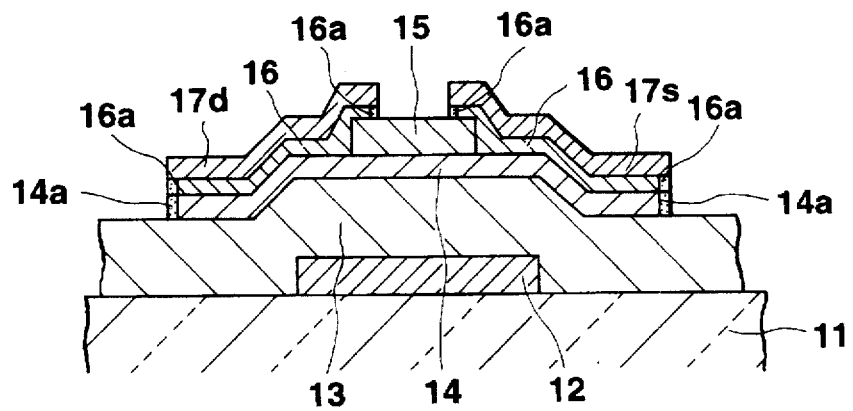

Then, the formed metal film 17 for source and drain electrodes is patterned by photolithography method to form a source electrode 17s and a drain electrode 17d, and a thin film transistor is completed, as shown in FIG. 9.

That is, the thin film transistor according to the above-described first embodiment is fabricated by forming the metal film 17 for source and drain electrodes to form the source and drain electrodes 17s and 17d, after forming an insulating film of an oxide on the peripheral side surface of the intrinsic semiconductor film 14 over the entire periphery and the entire height thereof. Accordingly, during formation of the metal film 17 for the source and drain electrodes 17s and 17d, no metal silicide layer is formed on the peripheral side surface of the intrinsic semiconductor film 14.

Therefore, the above-described thin film transistor does not produce any leakage current between the source and drain electrodes, which was produced through a metal silicide layer formed on the peripheral side surface of the intrinsic semiconductor film in conventional thin film transistors.

In the above-described method for fabricating a thin film transistor, after an insulating film 14a such as an oxide film or the like is formed on the peripheral side surface of the patterned intrinsic semiconductor film 14, the metal film 17 for source and drain electrodes is formed. Accordingly, when forming the metal film 17 for source and drain electrodes, no metal silicide layer is formed on the peripheral side surface of the intrinsic semiconductor film 14. Therefore, it is possible to fabricate a thin film transistor which can reduce production of leakage current between the source and drain electrodes.

In the method for fabricating a thin film transistor according to the embodiment, a blocking insulating film 15 is formed on the formed intrinsic semiconductor film 14, and the formed blocking insulating film 15 is patterned in shapes which cover the channel region of the intrinsic semiconductor film 14, after the step of forming the intrinsic semiconductor film 14, and prior to the step of forming the n-type semiconductor film 16. Therefore, according to the embodiment, the channel region of the intrinsic semiconductor film 14 does not suffer damage, during etching of the n-type semiconductor film 16 to be patterned which is formed on the intrinsic semiconductor film 14. Patterning of the intrinsic semiconductor film 14 is carried out by etching the intrinsic semiconductor film, using a resist mask 20 formed on the n-type semiconductor film 16 and the blocking insulating film 15 as a mask, when patterning the n-type semiconductor film 16. Formation of the insulating film 14a on the peripheral side surface of the intrinsic semiconductor film 14 is carried out by exposing the peripheral side surface to the oxygen plasma, prior to removing the resist mask. Accordingly, it is possible to efficiently carry out patterning of the n-type semiconductor film 16 and the intrinsic semiconductor film 14 and formation of the insulating film 14a on the peripheral side surface of the intrinsic semiconductor film 14, by a series of steps. It is also possible to obtain a good ohmic contact of the n-type semiconductor film 16 and the source and drain electrodes 17s and 17d formed thereon because the upper surface of the n-type semiconductor film 16 is not oxidized by the oxygen plasma, during formation of the insulating film 14a, e.g., an oxide or the like, on the peripheral side surface of the intrinsic semiconductor film 14.

In the method for fabricating according to the above-described embodiment, patterning of the intrinsic semiconductor film 14 is carried out by using a resist mask 20 which is formed on the n-type semiconductor film 16 for patterning thereof, and the blocking insulating film 15 as a mask, after patterning of the n-type semiconductor film 16. However, patterning of the intrinsic semiconductor film 14 may be carried out prior to forming the n-type semiconductor film 16. After the peripheral side surface of the intrinsic semiconductor film 14 is oxidized, the n-type semiconductor film 16 may be formed. In this case, the oxidation of the peripheral side surface of the intrinsic semiconductor film 14 may be carried out by the oxygen plasma, using a resist mask which is formed thereon for patterning the intrinsic semiconductor film 14, and the blocking insulating film 15 as a mask.

Second Embodiment

Next, a thin film transistor of the reverse staggered type according to a second embodiment of the present invention and a method for fabricating the same will be explained with reference to FIGS. 10–15.

Figure 14:
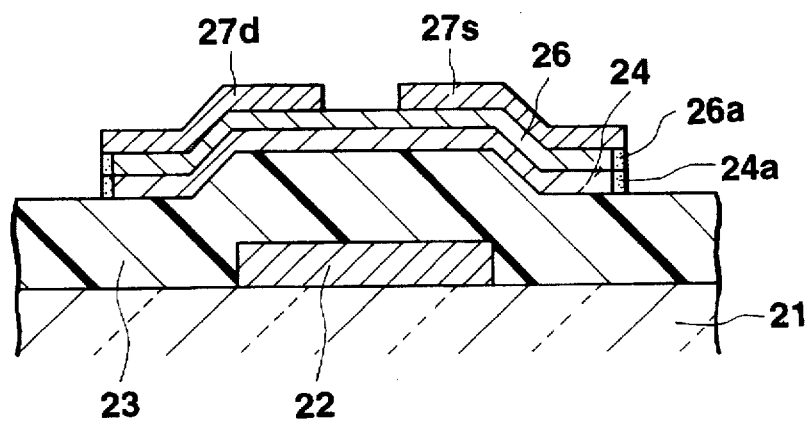
Figure 15:
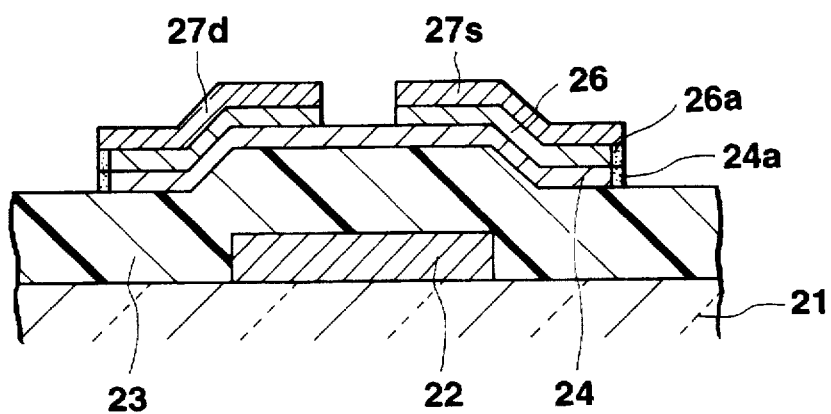

The thin film transistor according to this embodiment is different from that of the first embodiment in only that no blocking insulating film 15 is provided therein, as shown in FIG. 15. Because the thin film transistor according to this embodiment is approximately the same as that of the first embodiment in other respects, a detailed explanation for the structure of the thin film transistor will be omitted. FIGS. 10–15 are vertical sectional views illustrating successive steps in fabricating the thin film transistor according to this embodiment of the present invention. The thin film transistor is fabricated by the following steps.

Step 1

Figure 10:
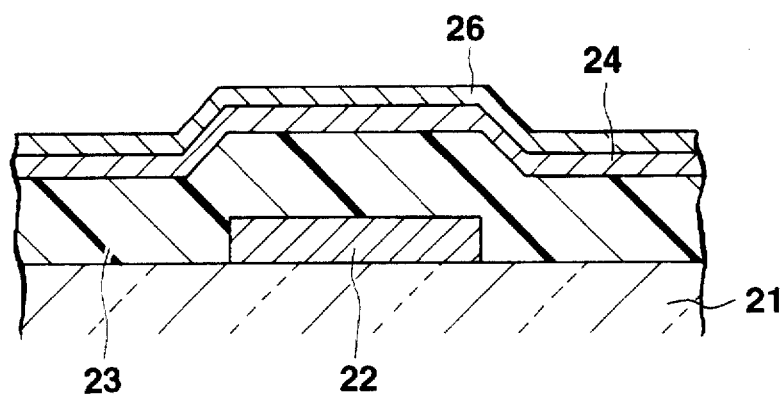
FIGS. 10-15 are vertical sectional views illustrating successive steps in fabricating the thin film transistor of the reverse staggered type according to a second embodiment of the present invention.

First, a gate electrode 22 of a metal is formed on a substrate 21 of glass or the like in the same manner as that of the first embodiment, and thereafter a gate insulating film 23 of silicon nitride, an intrinsic semiconductor film 24 of non-doped amorphous silicon, and an n-type semiconductor film 26 of doped amorphous silicon are formed on the substrate 21 in this order, by a plasma CVD system, as shown in FIG. 10.

Step 2

Figure 11:
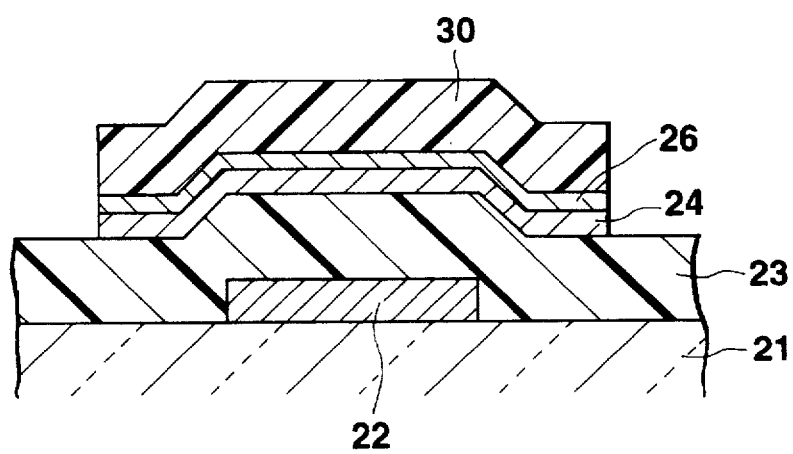

Next, the n-type semiconductor film 26 and the intrinsic semiconductor film 24 are patterned in this order by photolithography method, in a shape corresponding to a device region forming the transistor, as shown in FIG. 11. These patternings are performed by etching these films successively, using a resist mask 30 formed on the n-type semiconductor film 26. Therefore, the n-type semiconductor film 26 and the intrinsic semiconductor film 24 are patterned in approximately the same shape in plan.

Step 3

Figure 12:
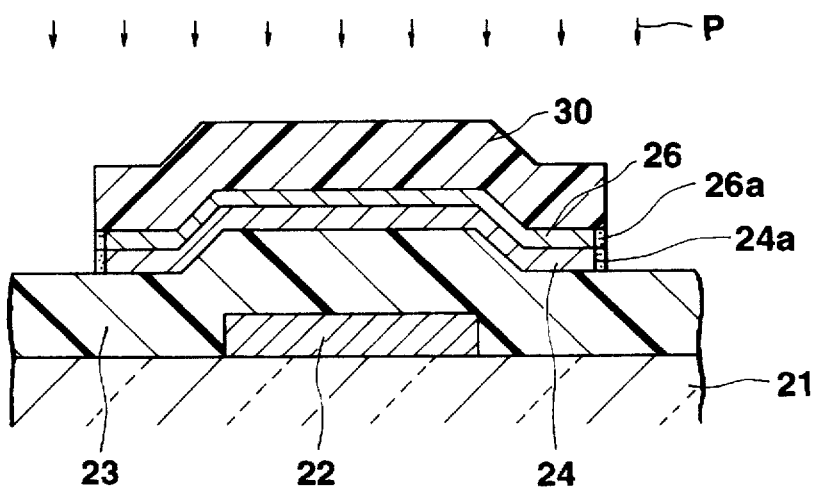

Then, the peripheral side surface of the intrinsic semiconductor film 24 is oxidized by using the oxygen plasma P, with the resist mask 30 on the n-type semiconductor film 26 being not removed and remaining, as shown in FIG. 12.

When the intrinsic semiconductor film 24 of amorphous silicon is oxidized by using the oxygen plasma P, with the resist mask 30 on the n-type semiconductor film 26 remaining, the exposed peripheral side surface of the intrinsic semiconductor film 24 is exposed to the oxygen plasma P, thereby the peripheral side surface is oxidized to form an oxide film 24a of silicon oxide over the entire periphery and the entire height thereof.

At this time, an oxide film 26a is also formed on the peripheral side surface of the n-type semiconductor film 26 because the exposed peripheral side surface of the n-type semiconductor film 26 is exposed to the oxygen plasma P and thereby is oxidized.

Step 4

Figure 13:
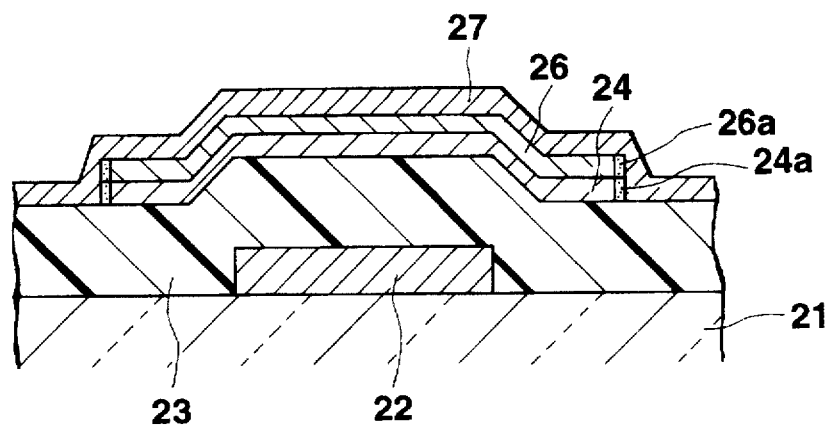

Next, the resist mask 30 is removed, and a metal film 27 for source and drain electrodes is formed by a sputtering system, as shown in FIG. 13.

During formation of the metal film 27 for source and drain electrodes, no metal silicide layer is formed on the peripheral side surface of the intrinsic semiconductor film 24 because the oxide film 24a of silicon oxide is formed over the entire periphery and the entire height of the exposed peripheral side surface of the intrinsic semiconductor film 24.

Step 5

Then, the formed metal film 27 for source and drain electrodes is patterned by photolithography method to form a source electrode 27s and a drain electrode 27d, as shown in FIG. 14.

Step 6

Thereafter, the portion of the n-type semiconductor film 26 which exists between the patterned source and drain electrodes 27s and 27d, is removed by etching to form a channel of the transistor, and the thin film transistor is completed, as shown in FIG. 15.

The thin film transistor according to the second embodiment is fabricated by forming the metal film 27 to form the source and drain electrodes 27a and 27d, after forming an insulating film of an oxide on the peripheral side surface of the intrinsic semiconductor film 24 over the entire periphery and the entire height thereof. Accordingly, during formation of the metal film 27 for the source and drain electrodes 27s and 27d, no metal silicide layer is formed on the peripheral side surface of the intrinsic semiconductor film 24. Therefore, it is possible to prevent production of any leakage current flowing between the source and drain electrodes through a metal silicide layer which was formed in conventional thin film transistors.

In the above-described method for fabricating a thin film transistor, no metal silicide layer is formed on at least a portion of the peripheral side surface of the intrinsic semiconductor film, which have the insulating film thereon and correspond to the region between the source and drain electrodes. Therefore, it is possible to fabricate a thin film transistor of the reverse staggered type which has no blocking insulating film on the intrinsic semiconductor film and which can reduce production of leakage current between the source and drain electrodes.

In the method for fabricating a thin film transistor according to the embodiment, patterning of the n-type semiconductor film 26 and of the intrinsic semiconductor film 24 is successively carried out by etching, using a resist mask 30 formed thereon. Formation of the insulating film on the peripheral side surface of the intrinsic semiconductor film 24 is carried out by exposing the peripheral side surface to the oxygen plasma, prior to removing the resist mask 30. Accordingly, it is possible to efficiently carry out patterning of the n-type semiconductor film 26 and the intrinsic semiconductor film 24 and formation of the insulating film 24a on the peripheral side surface of the intrinsic semiconductor film 24, by a series of steps. It is also possible to obtain a good ohmic contact of the n-type semiconductor film 26 and the source and drain electrodes 27s and 27d formed thereon because the upper surface of the n-type semiconductor film 26 is not oxidized by the oxygen plasma P, during formation of the oxide film 24a on the peripheral side surface of the intrinsic semiconductor film 24.

In the method for fabricating according to the above-described embodiment, patternings of the n-type semiconductor film 26 and the intrinsic semiconductor film 24 are successively carried out by using a resist mask. However, the patterning of the intrinsic semiconductor film 24 may be carried out prior to forming the n-type semiconductor film 26. After the peripheral side surface of the intrinsic semiconductor film 24 is oxidized, the n-type semiconductor film 26 may be formed.

Third Embodiment

Next, a thin film transistor according to a third embodiment of the present invention and a method for fabricating the same will be explained with reference to FIGS. 16–23.

Figure 16:
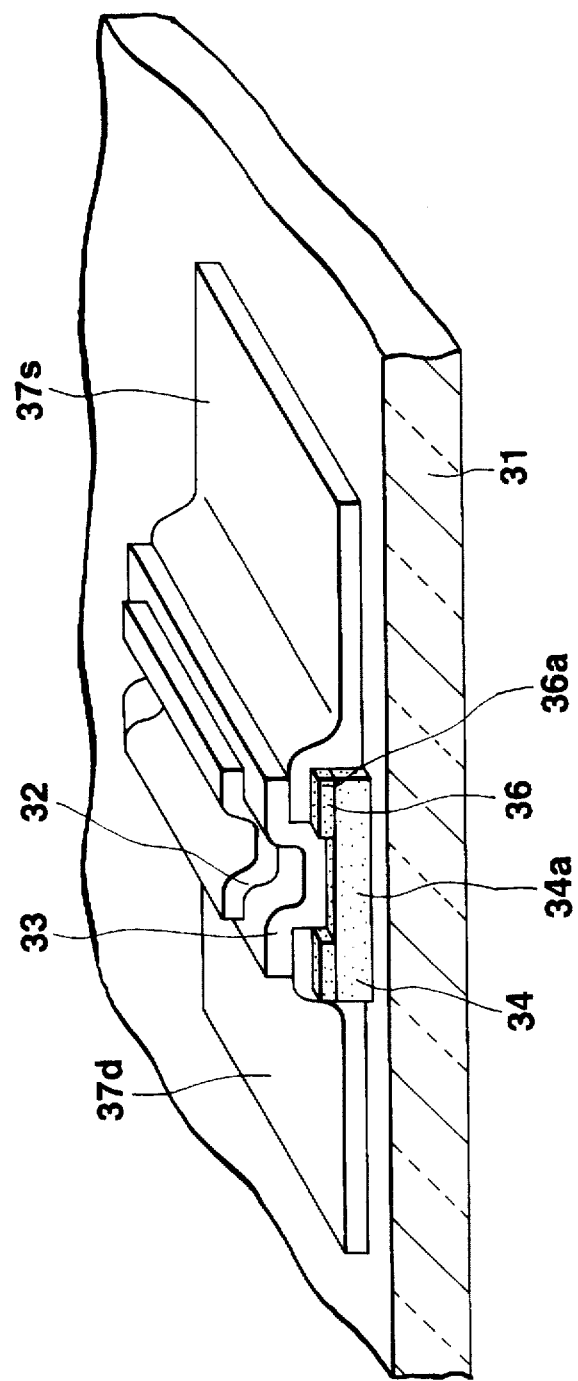
FIG. 16 is a perspective view of a thin film transistor of the coplanar type according to a third embodiment of the present invention.

FIG. 16 is a perspective view of a thin film transistor according to the third embodiment of the present invention.

As shown in this figure, the thin film transistor according to this embodiment has a structure of the so-called coplanar type. The thin film transistor comprises an intrinsic semiconductor film 34 of amorphous silicon formed on an insulating substrate 31 of glass or the like; an n-type semiconductor film 36 of doped amorphous silicon which is formed on the intrinsic semiconductor film 34 in shapes corresponding to those of the source and drain regions; a source electrode 37s and a drain electrode 37d which are formed on the n-type semiconductor film 36; and a gate electrode 32 of a metal which is provided on the source and drain electrodes 37s and 37d and on an exposed channel region of the intrinsic semiconductor film 34 through a gate insulating film 33 of silicon nitride. In this embodiment, the intrinsic semiconductor film 34 has approximately the same outline in plan as that of the n-type semiconductor film 36 in the source and drain regions.

In the thin film transistor according to this embodiment, an oxide film is formed on the entirety of the peripheral side surface of the intrinsic semiconductor film 34. In these figures, reference numeral 34a denotes an oxide film formed on the peripheral side surface of the intrinsic semiconductor film 34. The oxide film 34a is made of silicon oxide.

In this embodiment, also on the entirety of the peripheral side surface of the n-type semiconductor film 36 in the source and drain regions, an oxide film 36a of silicon oxide is formed.

FIGS. 17–23 are vertical sectional views illustrating successive steps in fabricating the thin film transistor of the coplanar type according to the third embodiment. The thin film transistor is fabricated by the following steps.

Step 1

Figure 17:
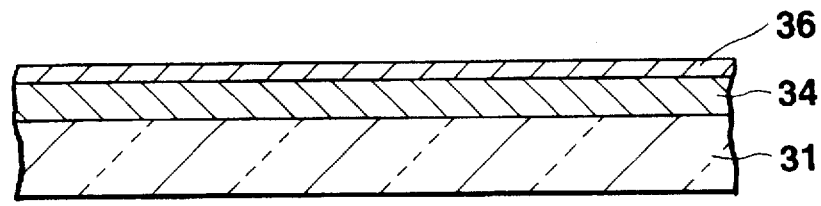
FIGS. 17-23 are vertical sectional views illustrating successive steps in fabricating the thin film transistor according to the third embodiment of the present invention.
Figure 18:
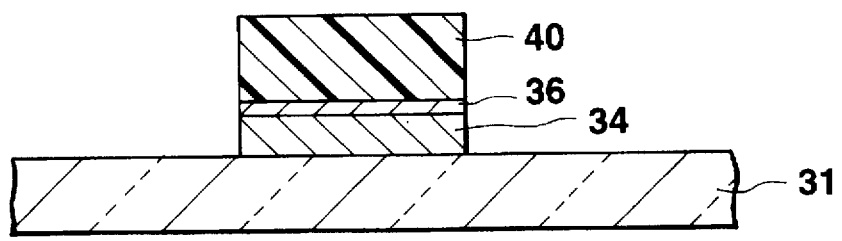

First, an intrinsic semiconductor film 34 of amorphous silicon and an n-type semiconductor film 36 of doped amorphous silicon are formed on an insulating substrate 31 of glass or the like, in this order, by a plasma CVD system, as shown in FIG. 17. Thereafter, the n-type semiconductor film 36 and the intrinsic semiconductor film 34 are patterned in a predetermined shape which forms a device region of the transistor, by photolithography method. In this embodiment, the n-type semiconductor film 36 and the intrinsic semiconductor film 34 are formed in approximately the same shape in plan, by an etching using a resist mask 40.

Step 2

Figure 19:
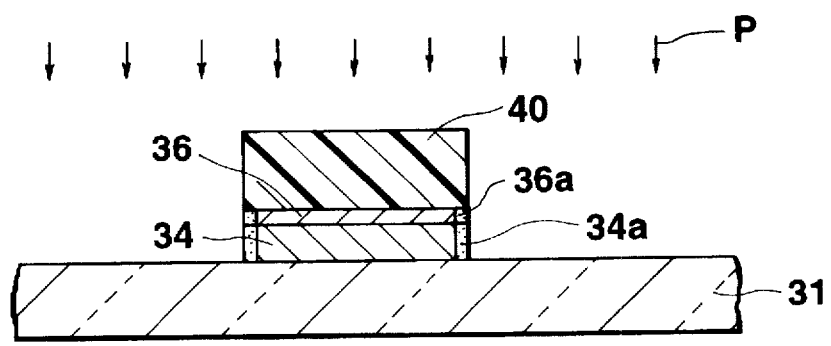

Next, the peripheral side surface of the intrinsic semiconductor film 34 is oxidized by using the oxygen plasma P, with the resist mask 40 on the n-type semiconductor film 36 being not removed and remaining, as shown in FIG. 19.

When the intrinsic semiconductor film 34 is oxidized by using the oxygen plasma P, with the resist mask 40 on the n-type semiconductor film 36 remaining, the exposed peripheral side surface of the intrinsic semiconductor film 34 of amorphous silicon is exposed to the oxygen plasma P, thereby the peripheral side surface is oxidized to form an oxide film 34a of silicon oxide over the entire periphery and the entire height thereof.

At this time, an oxide film 36a is also formed on the peripheral side surface of the n-type semiconductor film 36 because the exposed peripheral side surface of the n-type semiconductor film 36 is exposed to the oxygen plasma P and thereby is oxidized.

Step 3

Figure 20:
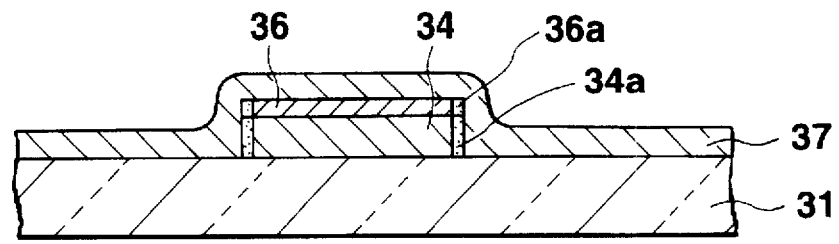

Next, after the resist mask 40 is removed, a metal film 37 for source and drain electrodes is formed by a sputtering system, as shown in FIG. 20.

During formation of the metal film 37 for source and drain electrodes, no metal silicide layer is formed on the peripheral side surface of the intrinsic semiconductor film 34 because the oxide film 34a of silicon oxide is formed over the entire periphery and the entire height of the exposed peripheral side surface of the intrinsic semiconductor film 34.

Step 4

Figure 21:
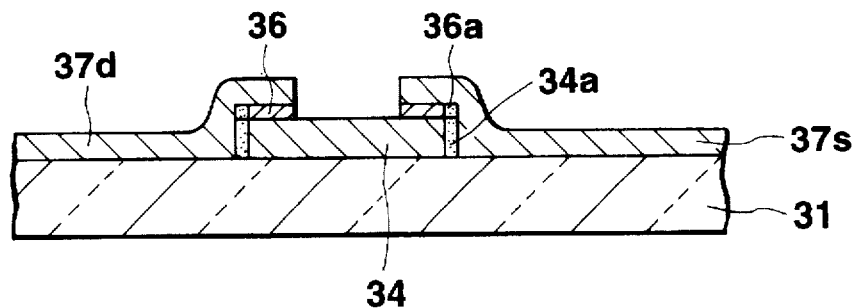

The formed metal film 37 for source and drain electrodes is patterned by photolithography method to form a source electrode 37s and a drain electrode 37d, as shown in FIG. 21. Thereafter, the portion of the n-type semiconductor film 36 which exists between the patterned source and drain electrodes 37s and 37d is removed by etching to form a channel of the transistor.

Step 5

Figure 22:
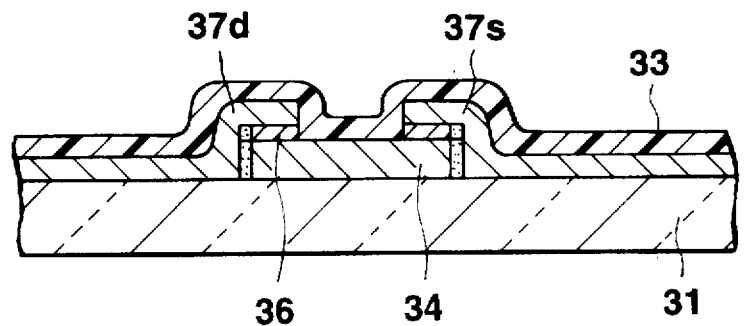
Figure 23:
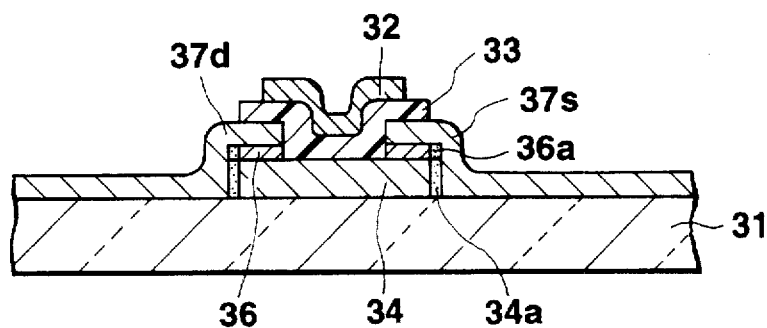
Figure 24:
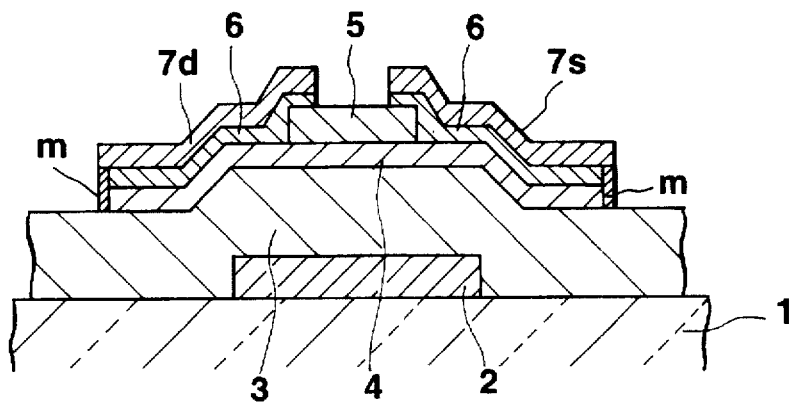
FIG. 24 is a vertical sectional view illustrating a conventional thin film transistor of the reverse staggered type.
Figure 25:
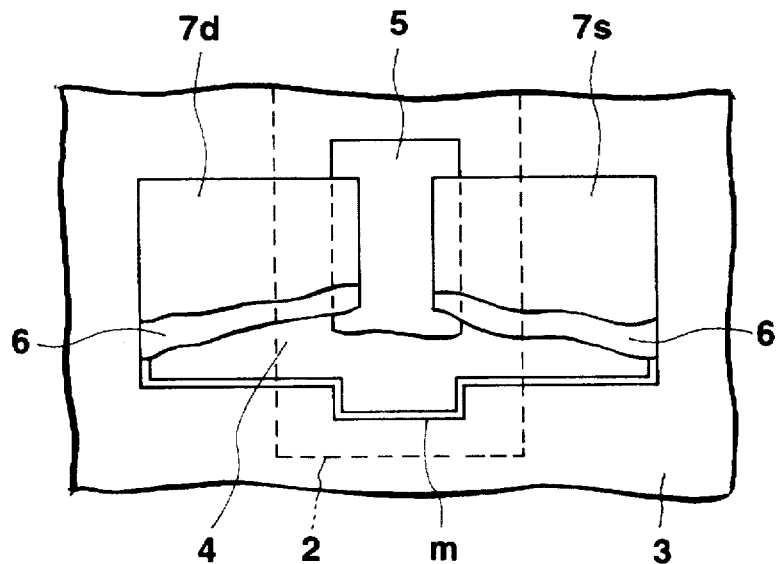
FIG. 25 is a partially broken plan view of the conventional thin film transistor.
Figure 26:
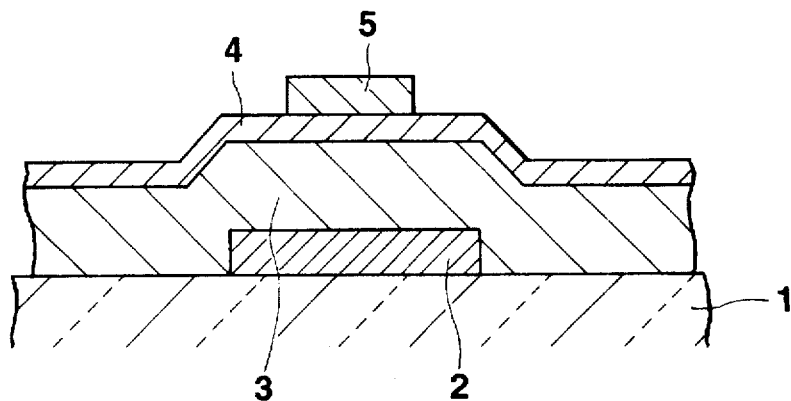
FIGS. 26-30 are vertical sectional views illustrating successive steps in fabricating the conventional thin film transistor of the reverse staggered type.
Figure 27:
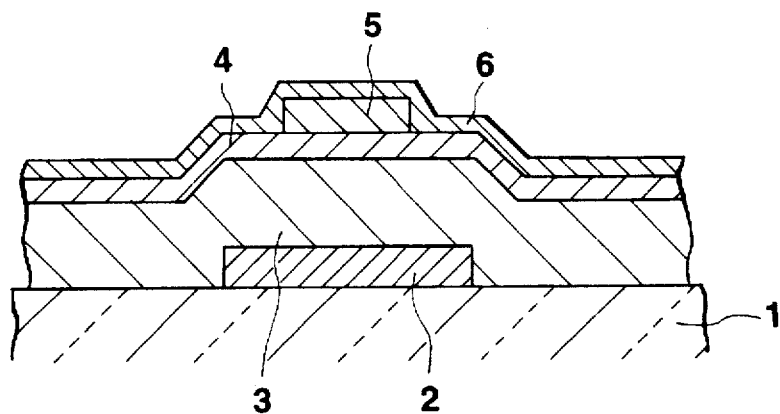
Figure 28:
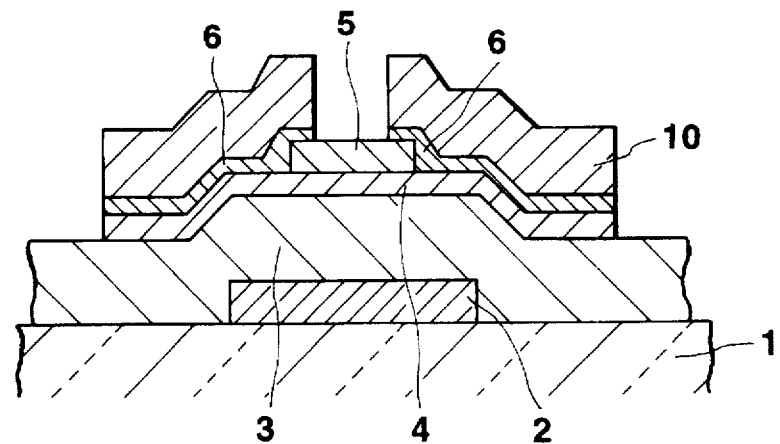
Figure 29:
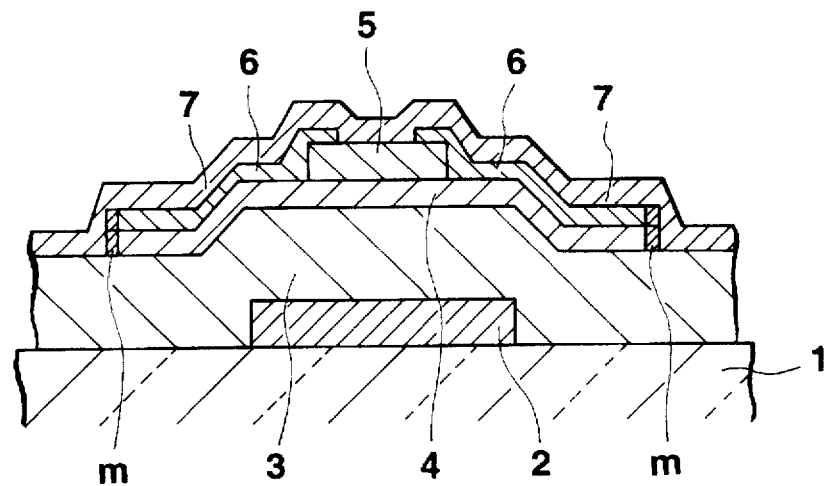
Figure 30:
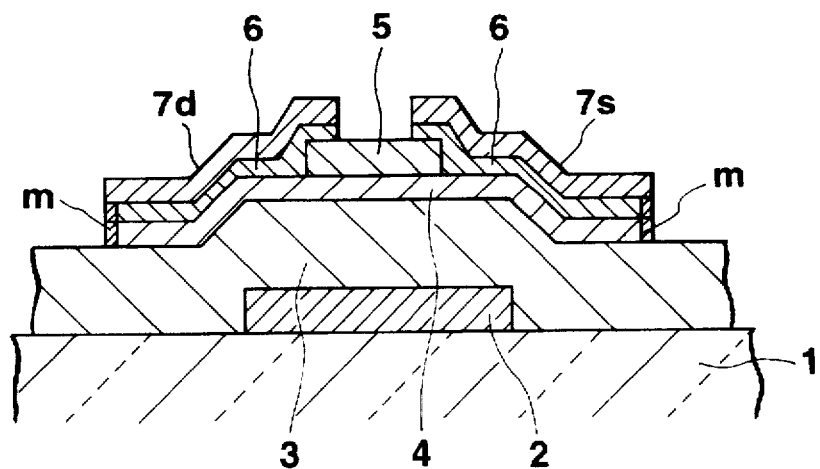

A gate insulating film 33 of silicon nitride is formed on the patterned source and drain electrodes 37s and 37d and on the exposed channel portion of the intrinsic semiconductor film 34 which exists therebetween, by a plasma CVD system, as shown in FIG. 22, and is patterned in a predetermined shape, as shown in FIG. 23.

Step 6

A metal film is formed on the patterned gate insulating film 33 by a sputtering system or the like, as shown in FIG. 23. Thereafter, the formed metal film is patterned in a predetermined shape by photolithography method to form a gate electrode 32, and a thin film transistor having a coplanar type structure is completed. Therefore, it is possible to prevent production of any leakage current flowing between the source and drain electrodes through a metal silicide layer which was formed in conventional thin film transistors, like the first embodiment.

In the above-described method for fabricating a thin film transistor, no metal silicide layer is formed on at least a portion of the peripheral side surface of the intrinsic semiconductor film, which have the insulating film thereon and correspond to the region between the source and drain electrodes. Therefore, it is possible to fabricate a thin film transistor of the coplanar type which can extremely reduce production of leakage current between the source and drain electrodes.

In the method for fabricating a thin film transistor according to the embodiment, patterning of the n-type semiconductor film 36 and of the intrinsic semiconductor film 34 is successively carried out by etching, using a resist mask 40 formed thereon. Formation of the insulating film on the peripheral side surface of the intrinsic semiconductor film 34 is carried out by exposing the peripheral side surface to the oxygen plasma, prior to removing the resist mask 40. Accordingly, it is possible to efficiently carry out patterning of the n-type semiconductor film 36 and the intrinsic semiconductor film 34 and formation of the insulating film 34a on the peripheral side surface of the intrinsic semiconductor film 34, by a series of steps. It is also possible to obtain a good ohmic contact of the n-type semiconductor film 36 and the source and drain electrodes 37s and 37d formed thereon because the upper surface of the n-type semiconductor film 36 is not oxidized by the oxygen plasma P, during formation of the oxide film 34a on the peripheral side surface of the intrinsic semiconductor film 34.

In each of the above-described embodiments, although an insulating film 14a, 24a, or 34a is formed on the entirety of the peripheral side surface of the intrinsic semiconductor film 14, 24, or 34, formation of the insulating film over the entire height thereof at a portion of each side of the peripheral side surface corresponding to the region between the source and the drain is enough. Even if a metal silicide layer is formed on the peripheral side surface of the intrinsic semiconductor film 14, 24, or 34, no leakage current is produced so long as the metal silicide layer is disconnected on at least a portion of each side of the peripheral side surface of the intrinsic semiconductor film corresponding to the region between the source and the drain. Because leakage current between the source and the drain through the metal silicide layer formed on the peripheral side surface of the intrinsic semiconductor film, is produced only when the metal silicide layer exists over the entire length of at least one side, which corresponds to the region between the source and the drain, of the peripheral side surface of the intrinsic semiconductor film 14, 24, or 34.

Formation of the insulating film 14a, 24a, or 34a on only the both sides, which corresponds to the region between the source and the drain, of the peripheral side surface of the intrinsic semiconductor film 14, 24, or 34, can be carried out by masking the portion on which no insulating film is to be formed, of the peripheral side surface of the intrinsic semiconductor film 14, 24, or 34, with a resist, and by an oxidizing treatment by the oxygen plasma or the like, a nitriding treatment in which the intrinsic semiconductor film reacts in an atmosphere of nitrogen, or the like.

In each of the above-described embodiments, although an oxide film is mainly used as an insulating film 14a, 24a, or 34a formed on the peripheral side surface of the intrinsic semiconductor film 14, 24, or 34, a film of another insulating material, e.g., a nitride film or the like, may be used.

In each of the above-described embodiments, although amorphous silicon is used for the intrinsic semiconductor film 14, 24, or 34 and for the n-type semiconductor film 16, 26, or 36, polysilicon can be also used.

What is claimed is:

1. A thin film transistor with reduced leakage current comprising:

a gate electrode;

a gate insulating film formed on said gate electrode;

an intrinsic semiconductor film provided on said gate insulating film for forming a channel region at a position at which said gate insulating film is sandwiched between said intrinsic semiconductor film and said gate electrode, said intrinsic semiconductor film having two peripheral side surfaces located at two edges thereof in widthwise directions of said channel region, and an insulating film formed in and as part of said two peripheral side surfaces;

an n-type semiconductor film provided on said intrinsic semiconductor film on both sides of said channel region; and source and drain electrodes respectively provided on opposite sides of said channel region and connected to respective portions of said intrinsic semiconductor film through said n-type semiconductor film.

2. The thin film transistor as claimed in claim 1, wherein said insulating film formed on said two peripheral side surfaces of said intrinsic semiconductor film comprises an oxide.

3. The thin film transistor as claimed in claim 1, wherein said insulating film formed on said two peripheral side surfaces of said intrinsic semiconductor film comprises a nitride.

4. The thin film transistor as claimed in claim 1, wherein said intrinsic semiconductor film comprises silicon.

5. The thin film transistor as claimed in claim 4, wherein said intrinsic semiconductor film comprises amorphous silicon.

6. The thin film transistor as claimed in claim 1, wherein said intrinsic semiconductor film comprises polysilicon.

7. The thin film transistor as claimed in claim 1, further comprising a blocking insulating film provided on said intrinsic semiconductor film, said blocking insulating film covering said channel region between said source electrode and said drain electrode.

8. The thin film transistor as claimed in claim 7, wherein said intrinsic semiconductor film and said n-type semiconductor film have approximately a same shape, in plan, in regions of said source and drain electrodes and said blocking insulating film.

9. The thin film transistor as claimed in claim 1, wherein said gate electrode is formed on an insulating substrate, and said intrinsic semiconductor film is disposed between said gate electrode and said source and drain electrodes.

10. The thin film transistor as claimed in claim 1, wherein said intrinsic semiconductor film is formed on an insulating substrate, and said source and drain electrodes are disposed between said gate electrode and said intrinsic semiconductor film.

11. The thin film transistor as claimed in claim 1, wherein said insulating film formed on said two peripheral side surfaces of said intrinsic semiconductor film is formed on an entirety of said two peripheral side surfaces.

12. A thin film transistor with reduced leakage current, comprising:

a gate electrode;

a gate insulating film formed on said gate electrode;

an intrinsic semiconductor film provided on said gate insulating film for forming a channel region at a position at which said gate insulating film is sandwiched between said intrinsic semiconductor film and said gate electrode, said intrinsic semiconductor film comprising silicon, having two peripheral side surfaces located at two edges thereof in widthwise directions of said channel region, and an insulating film formed on said two peripheral side surfaces of said intrinsic semiconductor film comprising an oxide which is formed by oxidizing said silicon of said intrinsic semiconductor film;

an n-type semiconductor film provided on said intrinsic semiconductor film on both sides of said channel region; and source and drain electrodes respectively provided on opposite sides of said channel region and connected to respective portions of said intrinsic semiconductor film through said n-type semiconductor film.

13. A thin film transistor with reduced leakage current comprising:

a gate electrode;

a gate insulating film formed on said gate electrode;

an intrinsic semiconductor film formed on said gate insulating film and having a channel region opposing said gate electrode;

n-type semiconductor films formed on and connected to respective portions of said intrinsic semiconductor film on opposite sides of said channel region;

source and drain electrodes respectively connected to respective ones of said n-type semiconductor films; and insulating films found in a portion of respective peripheral side surfaces of said intrinsic semiconductor film at edges of said intrinsic semiconductor film located in widthwise directions of said channel region, said insulating films protecting said peripheral side surfaces of said intrinsic semiconductor film to prevent metal silicide from being formed thereon.

14. A thin film transistor as claimed in claim 13, wherein said insulating films comprise one of an oxide film and a nitride film.

* * * * *